United States Patent

Yamada

(10) Patent No.: US 6,409,866 B1
(45) Date of Patent: Jun. 25, 2002

(54) PROCESS FOR MOUNTING SEMICONDUCTOR DEVICE

(75) Inventor: Yukio Yamada, Tochigi (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 09/563,508

(22) Filed: May 3, 2000

(30) Foreign Application Priority Data

May 28, 1999 (JP) .............................. 11-149801

(51) Int. Cl.⁷ .............................. H01L 23/12; H05K 3/30
(52) U.S. Cl. .................. 156/219; 156/293; 29/829; 29/832; 257/783; 438/119
(58) Field of Search ................. 156/219, 293; 257/782, 783, 778; 29/829, 832; 438/118, 119, 455

(56) References Cited

U.S. PATENT DOCUMENTS 4,811,081 A  *  3/1989  Lyden .......................... 357/80
6,137,183 A  * 10/2000  Sako .......................... 257/783

FOREIGN PATENT DOCUMENTS

JP          A 11-16949          1/1999

* cited by examiner

*Primary Examiner*—Jeff H. Aftergut
*Assistant Examiner*—Todd J. Kilkenny
(74) *Attorney, Agent, or Firm*—Oliff & Berridge, PLC

(57) ABSTRACT

A process for mounting a semiconductor device whereby electrodes of a fine-pitch semiconductor device and a wiring board can be surely connected to each other. A process for mounting a semiconductor by electrically connecting an electrode 42a of an IC chip 4 to an electrode 10a of a wiring board 1 by using an anisotropic conductive adhesive film 3 having conductive particles 31 dispersed in an insulating adhesive, which process involves: the step of tentatively thermocompression bonding an insulating adhesive layer 2 free from conductive particle 31 onto the wiring board 1 and then forming a concave 20 of a definite size in the insulating adhesive layer 2; and the step of putting in the concave 20 of the insulating adhesive layer 2 an anisotropic conductive adhesive film 3 and then putting an IC chip 4 into the concave 20 followed by positioning and thermocompression bonding.

28 Claims, 2 Drawing Sheets

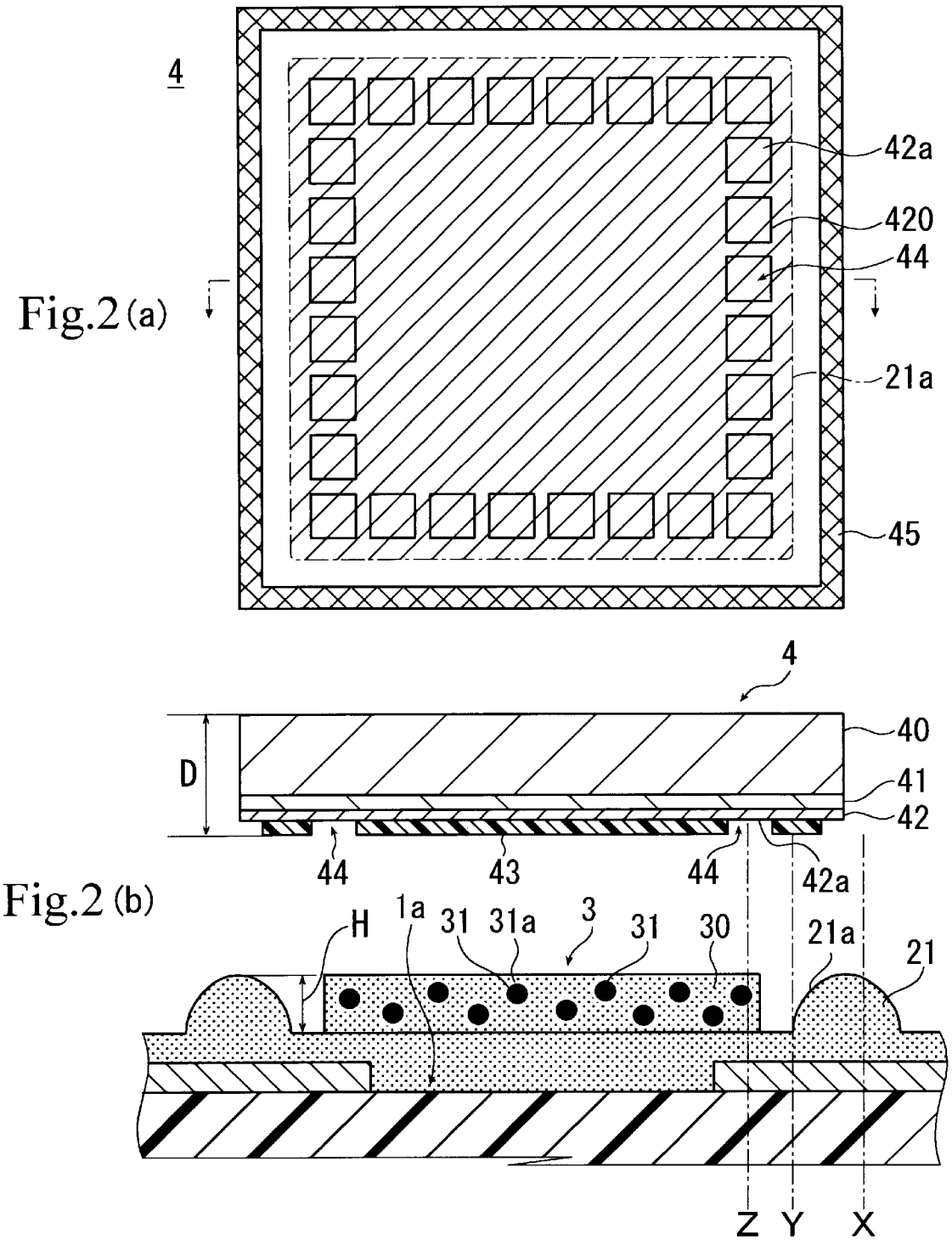

PROCESS FOR MOUNTING SEMICONDUCTOR DEVICE

FIELD OF THE INVENTION

This invention relates to a process for mounting a semiconductor device on a wiring board. More particularly, it relates to a process for mounting a semiconductor device whereby a bare chip is directly mounted on a substrate by using an anisotropic conductive adhesive film.

BACKGROUND OF THE INVENTION

To mount a bare chip directly on a wiring board such as a print wiring board, there has been known a process with the use of an anisotropic conductive adhesive film having conductive particles dispersed in a binder.

In this process for mounting a bare chip on a wiring board by using an anisotropic conductive adhesive film, it has been a practice to form protruding bump electrodes in the IC chip side or in the wiring board side.

This is because, in case of bumpless connection without forming any bump, conductive particles sometimes come into contact with the scribe line at the edge of the IC chip thereby causing a short-circuit.

In recent years, there has been required fine pitching between the electrodes of a wiring board of the above type. To satisfy this requirement for fine pitching, the connection electrode area between the wiring board and the IC chip should be reduced.

To achieve fine pitching in practice in the conventional mounting process, it is necessary to surely provide conductive particles between the electrodes. To ensure the existence of the conductive particles, it is suggested, for example, that the conductive particle diameter is further reduced so that a larger number of conductive particles can be contained in the binder of the anisotropic conductive adhesive film.

However, an increase in the content of the conductive particles in the binder is accompanied by an increase in the viscosity of the anisotropic conductive adhesive film and, in its turn, a decrease in the fluidity of the conductive particles in the binder. As a result, it becomes difficult to uniformly disperse the conductive particles in the binder. At the same time, there arises another problem that the insulation properties of the anisotropic conductive adhesive film are deteriorated.

When the conductive particle diameter is reduced, on the other hand, the absolute deformation caused by crushed conductive particles in the step of the thermocompression bonding becomes smaller and thus the irregularity in the bump electrode height cannot be compensated thereby. In such a case, it is feared that some of the electrodes of the wiring board and the IC chip undergo connection failure and thus the conduction reliability is lowered.

As discussed above, fine pitching cannot be sufficiently established in practice in the conventional mounting processes.

SUMMARY OF THE INVENTION

An object of the present invention, which has been completed to solve these problems encountering in the conventional art, is to provide a process for mounting a semiconductor device whereby electrodes of a fine-pitch semiconductor device and a wiring board can be surely connected to each other.

Another object of the present invention is to provide a process for mounting a semiconductor device whereby the occurrence of a short-circuit between a semiconductor device and a wiring board can be prevented in a bumpless IC chip.

According to the present invention, which has been made to achieve the above-mentioned objects, it is provided a process for mounting a semiconductor device by electrically connecting electrodes of the semiconductor device to electrodes of a wiring board, which process comprising; the step of tentatively thermocompression bonding a conductive particle-free filmy insulating adhesive to the wiring board and then forming an insulating adhesive layer having a concave of a predetermined size in the insulating adhesive layer; and the step of putting the anisotropic conductive adhesive film having conductive particles dispersed in an insulating adhesive, in the concave of the insulating adhesive layer and then putting the semiconductor device in the concave followed by positioning and thermocompression bonding.

In thermocompression bonding with the use of an anisotropic conductive adhesive film, it is generally observed that conductive particles tend to run off together with the insulating adhesive toward the edge of the IC chip. In the case of the present invention, however, the conductive particles tending to run off toward the IC chip edge are blocked by the brim of the concave formed in the insulating adhesive layer. Thus, the conductive particles scarcely f low in the direction of the IC chip edge.

According to the present invention, therefore, the conductive particles can be densely held between the semiconductor device and the wiring board. Thus, plural conductive particles can be provided on each electrode at an extremely high probability and connection electrodes can be surely electrically connected to each other without fail even in a case where connection electrodes are located at very small intervals.

According to the present invention, moreover, no conductive particle reach the scribe line part of the IC chip edge and, therefore, there arises no short-circuit between the scribe line and the wiring board.

According to the present invention, a fine-pitch semiconductor device can be surely mounted on a wiring board with the use of only a small amount of conductive particles as described above, which contributes to the cost reduction.

In the present invention, it is also effective that the inner wall of the concave of the insulating adhesive layer is located inside the scribe line of the wiring board but outside the outmost edge of the connection electrode of the semiconductor device.

According to the present invention, conductive particles in a larger amount can be provided on each connection electrode and the occurrence of a short-circuit between the scribe line and the wiring board can be surely prevented.

According to the invention, it is also effective that the concave of the insulating adhesive layer is formed in such a manner that it has a depth less than the thickness of the bare chip but more than the size (nearly equal to outer diameter) of the conductive particles in the anisotropic conductive adhesive film.

According to the present invention, run of f of the conductive particles can be more effectively prevented in the step of the thermocompression bonding and a thermocompression bonding head can be prevented from stains caused by the insulating adhesive resin squeezed out from the IC chip.

According to the present invention, when the insulating adhesive layer has a melt viscosity larger than the melt viscosity of the anisotropic conductive adhesive film, then the run off of the conductive particles can be surely prevented. Thus, the occurrence of a short-circuit between the scribe line and the wiring board can be prevented without fail and, at the same time, the existence of a larger number of conductive particles can be ensured on each connection electrode.

It is particularly advantageous in lessening the run off of the conductive particles that the melt viscosity of the insulating adhesive layer is from $1\times10^6$ to $1\times10^9$ mPa·s.

According to the present invention, it is effective to use as the anisotropic conductive adhesive film containing conductive particles surface-coated with a resin having a softening point higher than the temperature at which the insulating adhesive layer is tentatively thermocompression bonded.

According to the present invention, the conductive particles are surface-coated with an insulating layer and, therefore, the conductive particles can be employed in a larger amount. Thus, the number of the conductive particles existing on each connection electrode can be increased and the conduction reliability can be elevated.

In addition, it is also effective in the present invention that using the anisotropic conductive adhesive film having an average particle diameter of the conductive particles of from 1 to 10 μm and a content of the conductive particles of from 1 to 15% by volume.

According to the present invention, the conduction resistance can be reduced and the conduction reliability can e elevated. In this case, moreover, the insulation resistance between electrodes adjacent to each other can be increased.

On the other hand, it is also effective that the following relationship is satisfied in the process:

$$V_1+V_2 \geq V_3+V_4$$

wherein $V_1$ stands for the volume of the insulating adhesive layer; $V_2$ stands for the volume of the anisotropic conductive adhesive film; $V_3$ stands for the volume of the adhesion part of the wiring board; and $V_4$ stands for the volume of the contact hole in the pad of the bumpless semiconductor device, as in the present invention.

According to the present invention, a fine-pitch semiconductor device can be surely mounted on a wiring board without forming any bump.

BRIEF DESCRIPTION OF THE DRAWINGS

FIGS. 2(a) and 2(b) illustrate the dimensional relation between an IC chip and a concave of an insulating adhesive layer in the present invention. FIG. 2(a) is a plan view of the electrode side of an IC chip, while FIG. 2(b) is a sectional view of the IC chip and a wiring board.

DETAILED DESCRIPTION OF THE INVENTION

Now, a preferred embodiment of the process for mounting a semiconductor device according to the present invention will be illustrated in detail by reference to the drawings.

FIGS. 1(a) to 1(e) show an example of the process for mounting a semiconductor device of the present invention, while FIGS. 2(a) and 2(b) illustrate the dimensional relation between an IC chip and a concave of an insulating adhesive layer in the present invention. FIG. 2(a) is a plan view of the electrode side of an IC chip, while FIG. 2(b) is a sectional view of the IC chip and a wiring board.

Figure 1:
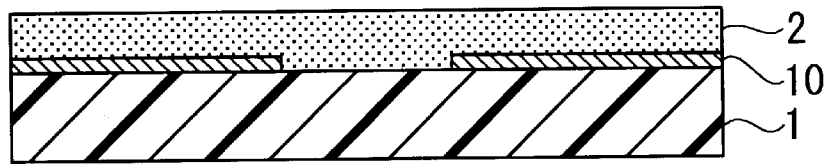
FIGS. 1(a) to 1(e) show an example of the process for mounting a semiconductor device of the present invention.
Figure 1:
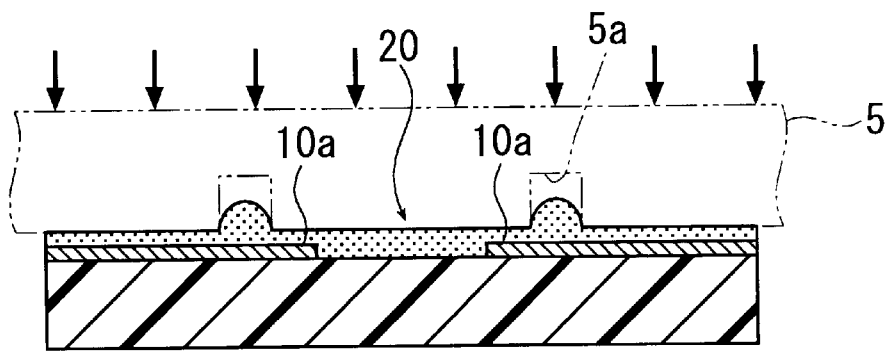
Figure 1:
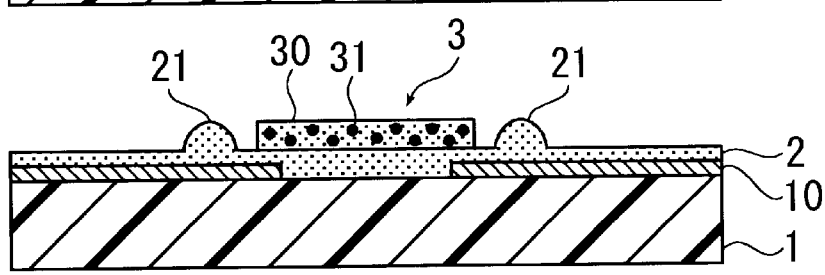
Figure 1:
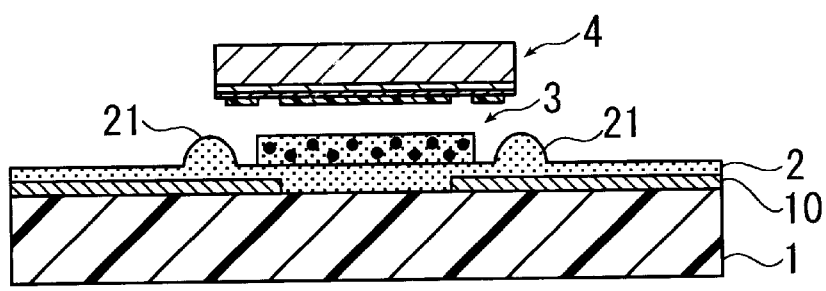
Figure 1:
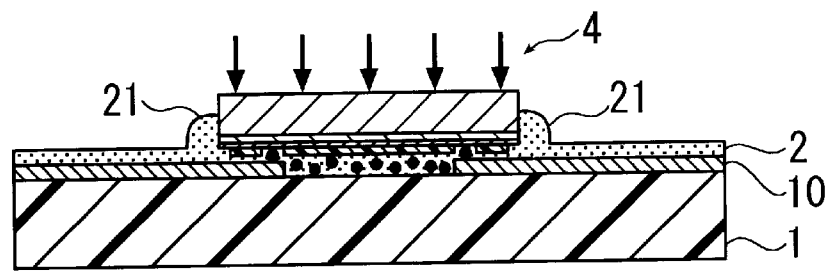

In this embodiment, a conductive particle-free filmy insulating adhesive is placed on a wiring board 1 having a predetermined circuit pattern 10 formed thereon in such a manner as to cover a connection electrode 10a followed by tentative thermocompression bonding at about 80° C., thereby forming an insulating adhesive layer 2, as shown in FIG. 1(a), From the viewpoint of preventing the run off of the conductive particles, it is preferable that the insulating adhesive to be used in the present invention is one having a melt viscosity larger than that of the insulating adhesive 30 in the anisotropic conductive adhesive film 3 as will be described hereinafter.

It is also preferable that this insulating adhesive has a melt viscosity, in particular, a minimum melt viscosity (i.e., the lowest melt viscosity during the thermocompression bonding) of from $1\times10^6$ to $1\times10^9$ mPa·s, more preferably from $5\times10^6$ to $5\times10^8$ mPa·s.

When the minimum melt viscosity of the insulating adhesive is less than $1\times10^6$ mPa·s, there arises a problem of run off of the conductive particles. When the minimum melt viscosity thereof exceeds $1\times10^9$ mPa·s, on the other hand, there arises another problem of inhibiting the conduction between connection electrodes.

Examples of the insulating adhesive include a mixture of a solid epoxy resin of bisphenol A type with a liquid epoxy resin of bisphenol A type and a mixture of a thermoplastic resin (phenoxy resin, acrylic resin, polyester resin, etc.) with an epoxy resin.

Next, a concave 20 having a definite shape and a predetermined size is formed in the insulating adhesive layer 2 close to the connection part 1a (see FIG. 2(b)) of the wiring board 1 by heat-pressing with the use of, for example, a thermocompression bonding head 5 provided with grooves 5a corresponding to the size and shape of the IC chip 4 as will be described hereinafter, as shown in FIG. 1(b).

As the IC chip 4 to be used in the present invention, either IC chip having bumps or a bumpless IC chip is usable. To illustrate this embodiment, a bumpless IC chip is employed by way of example.

In the IC chip 4 employed in this embodiment as shown in FIGS. 2(a) and 2(b), a predetermined circuit pattern 42 is formed on an oxide film ($SiO_2$) 41 of a silicone wafer 40 and a protective oxide film (a passivation film) 43 is further formed in such a manner as to cover the circuit pattern 42 excluding the pad 42a. Then the pad 42a of IC chip 4 is electrically connected to the connection electrode 10a of the wiring board 1 via the conductive particles 31 put into the contact hole 44 on the pad 42a.

In this embodiment, the concave 20 is formed in the insulating adhesive layer 2 and then an anisotropic conductive adhesive film 3 is put into this concave 20 followed by tentative thermocompression bonding, as FIG. 1(c) shows. This anisotropic conductive adhesive film 3 has conductive particles 31 dispersed in the insulating adhesive 30.

In this embodiment, a brim 21 is formed around the concave 20. As FIG. 2(b) shows, it is preferable that the height H of the brim 21 (i.e., the depth of the concave 20) is less than the thickness D of the IC chip 4 (the distance to the bump of the IC chip 4, if formed) but more than the outer diameter of the conductive particles 31 in the anisotropic conductive adhesive film 3 as will be described hereinafter.

When the depth H of the concave 20 of the insulating adhesive layer 2 is less than the outer diameter of the conductive particles 31, there arises a problem that the run off of the conductive particles 31 cannot be sufficiently prevented in the step of the thermocompression bonding. When the depth H is more than the thickness of the IC chip 4, on the other hand, it is feared that the thermocompression bonding head might be stained by the insulating adhesive resin squeezed out from the IC chip.

As FIG. 2(a) and 2(b) show, it is preferable that the inner wall 21a of the brim 21 of the concave 20 is located inside the scribe line 45 but outside the outmost edge 420 of the pad 42a of the IC chip 4.

When the inner wall 21a of the brim 21 of the concave 20 reaches the scribe line 45 of the IC chip 4, it is feared that the conductive particles 31 might come into contact with the scribe line 45 so as to cause short-circuit. When the inner wall 21a of the brim 21 of the concave 20 reaches the pad 42a of the IC chip 4, on the other hand, there arises a problem that only a small number of the conductive particles come into contact with the pad 42a and thus the conduction reliability is lowered.

From the viewpoint of ensuring a sufficient conduction reliability, it is preferable that the anisotropic conductive adhesive film 3 to be used in the present invention has a thickness of from 1 to 30 μm.

From the viewpoint of ensuring the provision of the conductive particles on the connection electrode, it is preferable that the anisotropic conductive film 3 has a size (expressed in the length of a side) 0.5 to 2 times longer than the height H of the brim 21 of the concave 20.

On the other hand, it is preferable from the viewpoint of ensuring sufficient insulation properties in the present invention to use as the conductive particles 31 in the anisotropic conductive adhesive film 3 those having been surface-coated with a coating resin layer 31a which has a softening point higher than the heating temperature employed in the step of the tentative thermocompression bonding.

The softening point of the coating resin preferably ranges from 80 to 300° C., more preferably from 80 to 200° C.

Examples of the coating resin include epoxy resins and acrylic-styrene copolymer resins.

From the viewpoint of ensuring a sufficient conduction reliability, it is preferable that the average particle diameter of the conductive particles 31 ranges from 1 to 10 μm, more preferably from 2 to 8 μm.

It is also preferable that the conductive particles 31 are dispersed in the insulating adhesive 30 at a ratio of form 1 to 15% by volume, more preferably from 3 to 15% by volume.

When the content of the conductive particles 31 is less than 1% by volume, there arises a problem that the electrical connection between the pad 42a of the IC chip 4 and the connection electrode 10a of the wiring board 1 cannot be surely established and thus the conduction resistance is increased. When the content of the conductive particles 31 exceeds 15% by volume, on the other hand, there arises another problem that the conductive particles 31 aggregate together and thus the insulation resistance between electrodes adjacent to each other is lowered.

From the viewpoint of ensuring a sufficient connection reliability, it is preferable in the present invention that the following relationship is satisfied:

$$V_1 + V_2 \geq V_3 + V_4$$

wherein $V_1$ stands for the volume of the insulating adhesive layer 2; $V_2$ stands for the volume of the anisotropic conductive adhesive film 3; $V_3$ stands for the volume of the adhesion part 1a of the wiring board 1; and $V_4$ stands for the volume of the contact hole 44 in the pad 42a of the IC chip 4.

After tentatively thermocompression bonding the anisotropic conductive adhesive film 3, the IC chip 4 is positioned as shown in FIG. 1(d). Then, the IC chip 4 is thermocompression bonded by heating onto the anisotropic conductive adhesive film 3 as shown in FIG. 1(e).

Thus, the anisotropic conductive adhesive film 3 and the insulating adhesive layer 2 are squashed by the IC chip 4. The conductive particles 31 of the anisotropic conductive adhesive film 3 are pressed between the connection electrode 10a of the wiring board 1 and the pad 42a of the IC chip 4.

As a result, the coating resin layer 31a on the surface of the conductive particles 31 is broken and thus the surface of the conductive particles 31 comes into contact with the connection electrode 10a of the wiring board 1 and the pad 42a of the IC chip 4, thereby electrically connecting the IC chip 4 to the wiring board 1.

In the embodiment of the present invention in this case, the conductive particles 31 tending to run off along the edge of the IC chip 4 are blocked by the brim 21 of the concave 20 formed in the insulating adhesive layer 2. Thus, the conductive particles scarcely flow toward the edge of the IC chip 4.

Consequently, the conductive particles can be densely held between the IC chip 4 and the wiring board 1. Thus, plural conductive particles 31 can be provided on the connection electrode 10a of the wiring board 1 and the pad 42a of the IC chip at an extremely high probability so as to electrically connect the connection electrodes to each other without fail even in a case where the connection electrodes are located at very small intervals.

According to this embodiment of the present invention, moreover, no conductive particle 31 reaches the scribe line 45 at the edge of the IC chip 4. Thus, there arises no short-circuit between the scribe line 45 and the wiring board 1.

According to this embodiment, therefore, a bumpless fine-pitch IC chip can be surely mounted on the wiring board 1 with the use of only a small amount of the conductive particles 31, which contributes to the cost reduction.

While a preferred embodiment of the present invention has been described, it is to be understood that the invention is not restricted thereto and many modifications and variations thereof are possible.

For example, the concave and brim of the insulating adhesive layer may have various shapes and the concave may be formed by procedures other than heat pressing.

The present invention is also applicable to mounting of semiconductor devices having bumps in various shapes.

EXAMPLES

Now, Examples and Comparative Examples of the anisotropic conductive adhesive film according to the present invention will be described in detail.

EXAMPLES 1 TO 4 AND COMPARATIVE EXAMPLES 1 TO 8

(Formation of Adhesive Film for Forming Concave and Anisotropic Conductive Adhesive Film)

First, a solid bisphenol A-type epoxy resin (EP1009™ manufactured by Yuka-Shell), a liquid bisphenol A-type epoxy resin (EP828™ manufactured by Yuka-Shell), a phenoxy resin (YP50™ manufactured by Tohto Kasei), an imidazole-based curing agent (HX3941™ manufactured by Asahi-Ciba) and SiO$_2$ particles (SOE2™ manufactured by Tatsumori) were dissolved in toluene employed as a solvent to give an insulating adhesive resin (binder) solution.

The obtained solution was applied onto a release film made of PET and dried. Thus, the adhesive films (1) to (4) for forming concave as shown in Table 1 were obtained.

TABLE 1

Insulating adhesive layers for forming concave
On the other hand, conductive particles having an average particle diameter of 5 μm, which had been prepared by plating

|  | Thickness (μm) | Melt viscosity (mP · S) |
|---|---|---|
| Adhesive (1) | 5 | 1 × 10$^7$ |
| Adhesive (2) | 20 | 1 × 10$^7$ |
| Adhesive (3) | 40 | 1 × 10$^7$ |
| Adhesive (4) | 20 | 1 × 10$^5$ |
| Adhesive (5) | 20 | 1 × 10$^7$ | benzoguanamine particles with nickel/gold and further forming an acrylic/styrene insulating layer thereon, were added to the binder solution as described above to give a binder paste.

The binder paste obtained above was applied to the release PET film and dried to thereby give an adhesive film (5) for forming concave as shown in Table 1.

Further, the above-described binder paste was applied to the release PET film and dried to give the anisotropic conductive adhesive films (1) to (3) as shown in Table 2.

TABLE 2

Anisotropic conductive films

|  | Thickness (μm) | Melt viscosity (mP · S) | Insulating coating |
|---|---|---|---|
| Adhesive (1) | 5 | 1 × 10$^6$ | yes |
| Adhesive (2) | 20 | 1 × 10$^6$ | yes |
| Adhesive (3) | 20 | 1 × 10$^8$ | yes |

(Evaluation)

The insulating adhesive films (1) to (4) for forming concave and the anisotropic conductive adhesive films (1) to (3), each as described above, were combined as shown in Table 3 and IC chips were mounted on wiring boards by the process as shown in FIGS. 1(a) to 1(e) and 2(a) and 2(b).

As a TEG for evaluation, use was made of an IC chip obtained by using a substrate (6.3 mm$^2$) provided with an SiO$_2$ film (thickness: 0.5 μm) forming on a silicone wafer (thickness: 400 μm), forming an aluminum (AL) electrode (thickness: 0.1 μm) on the substrate, and further forming a passivation film of Si$_3$N$_4$ (thickness: 0.8 μm) thereon.

This IC chip was provided with 160 pads (pitch: 100 μm) and a scribe line (width: 50 μm). The distance between the outer edge of each pad and the scribe line was 150 μm.

As the wiring board, on the other hand, use was made of a rigid substrate obtained by forming a copper (Cu) pattern (width: 18 μm, pitch: 150 μm) on a heat-resistant glass cloth composite epoxy resin copper clad laminate (FR-4) of 1.1 mm in thickness, and followed by plating with nickel/gold.

As FIG. 2(b) shows, the brim of the concave was formed in 3 manners, i.e., outside the IC chip (X), between the IC chip and the pad (Y) and on the pad of the IC chip (Z).

Thermocompression bonding was performed at 180° C. under a pressure of 30 kgf/cm$^2$ for 20 seconds. The insulation resistance and the conduction resistance between terminals adjacent to each other were measured.

With respect to the conduction resistance, a sample the conduction resistance of which was elevated by 100 mΩ or less was referred to as good (O), while the conduction resistance of which was elevated by more than 100 mΩ was referred to as poor (x).

With respect to the insulation resistance, a sample the insulation resistance of which was 1×10$^8$ Ω or more was referred to as good (O), while one the insulation resistance of which was less than 1×10$^8$ Ω was referred to as poor (x).

As Table 3 shows, the evaluation of Examples 1 to 4 were excellent both in the conduction resistance and the insulation resistance.

In contrast thereto, the evaluation of Comparative Examples 1 to 8 were poor either in the conduction resistance or the insulation resistance.

Among all, the sample of Comparative Example 1 with the use of the adhesive for forming concave which contained conductive particles and the sample of Comparative Example 2 free from any adhesive for forming concave underwent short-circuit at the scribe line of the IC chip.

In the samples of Comparative Examples 7 and 8 wherein the melt viscosity of the adhesive for forming concave was lower than the melt viscosity of the anisotropic conductive adhesive film, the brim of the concave was washed away by the anisotropic conductive adhesive film in the step of the thermocompression bonding, thereby giving only a poor insulation resistance.

TABLE 3

Results of evaluation of samples of Examples and Comparative Examples

|  | Adhesive for forming concave | Brim height (μm) | Adhesive for ACF | Brim location | Insulation resistance | Conduction reliability |
|---|---|---|---|---|---|---|
| Comparative example 1 | (5) | — | — | — | x | o |
| Comparative example 2 | — | — | (2) | — | x | o |
| Comparative example 3 | (2) | 0 | (2) | — | x | o |
| Comparative example 4 | (2) | 5 | (2) | Y | x | o |
| Example 1 | (2) | 10 | (2) | Y | o | o |
| Comparative example 5 | (2) | 10 | (2) | Z | o | x |
| Comparative example 6 | (2) | 10 | (2) | X | x | o |
| Comparative example 7 | (2) | 10 | (3) | Y | x | o |
| Comparative example 8 | (4) | 10 | (2) | Y | x | o |
| Example 2 | (1) | 7 | (2) | Y | o | o |
| Example 3 | (3) | 20 | (2) | Y | o | o |
| Example 4 | (2) | 10 | (1) | Y | o | o |
| Comparative example 9 | (1) | 7 | (1) | Y | o | x |

In the sample of Comparative Example 9 wherein the height of the brim of the concave was close to the thickness of the anisotropic conductive adhesive film, the amount of the adhesive was insufficient and thus only a poor conduction resistance was obtained.

EXAMPLES 5 TO 8 AND COMPARATIVE EXAMPLES 10 TO 12

By using an anisotropic conductive adhesive film (CP84301Q™ manufactured by SONY CHEMICAL) containing $1 \times 10^6/mm^3$ of the same conductive particles as those employed in the above Examples and Comparative Examples and having a thickness of 25 μm and an IC chip (outer diameter: 6.3 $mm^2$, thickness: 0.2 mm) having bumps of 3600 $nm^2$ (outer size: 60 $μm^2$, pitch: 100 μm, height: 20 μm), the IC chip was mounted on the wiring board by the process as shown in FIGS. 1(a) to 1(e) and 2(a) and 2(b).

As the adhesive for forming concave, use was made of the above-described anisotropic conductive adhesive film (adhesive (1)) and those obtained by removing the conductive particles from the above-described anisotropic conductive adhesive film and containing 10% by volume of $SiO_2$ particles of 0.2 μm in average particle diameter (adhesives (2) to (5)). The surface of the above-described IC chip was coated with silicone and the concave was formed at a temperature of 50° C. under a pressure of 100 kgf/$cm^2$ per one bump for 2 seconds. In this case, the inner wall of the brim of the concave was located between the IC chip and the pad (Y).

On the other hand, the thermocompression bonding was performed at a temperature of 200° C. under a pressure of 400 kgf/$cm^2$ per one bump for 10 seconds. Then the probability of the existence of the conductive particles on the bump and the conduction reliability were evaluated. Table 4 shows the results.

ing adhesive layer showed a low probability of the existence of the conductive particles on the bump and a poor conduction reliability.

The evaluation of Comparative Example 11 wherein the height of the brim of the concave was less than the outer diameter of the conductive particles showed a low probability of the existence of the conductive particles on the bump and a poor conduction reliability.

Further, in the sample of Comparative Example 12 wherein the height of the brim of the concave was much more than the thickness of the anisotropic conductive adhesive film, the thermocompression bonding head was stained by the insulating adhesive resin squeezed out from the IC chip.

EFFECTS OF THE INVENTION

According to the present invention, plural conductive particles can be provided on each connection electrode at an extremely high probability and connection electrodes can be surely electrically connected to each other without fail even in a case where the connection electrodes are located at very small intervals, as described above.

According to the present invention, moreover, short-circuit between the scribe line and the wiring board can be prevented in a case with the use of a bumpless IC chip.

According to the present invention, therefore, a fine-pitch semiconductor device can be surely mounted on a wiring board with the use of only a small amount of conductive particles, which contributes to the cost reduction.

What is claimed is:

1. A process for mounting a semiconductor device on a wiring board, comprising:
    tentatively thermocompression bonding a conductive particle-free insulating adhesive onto a wiring board to thereby form an insulating adhesive layer;

TABLE 4

Results of the evaluation of samples of Examples and Comparative Examples

| | Adhesive for forming concave | SiO₂ particle (wt. %) | Brim height (μm) | Av. particle no. before thermo-compression bonding | Av. particle no. after thermo-compression bonding | Av. probability (%) | Minimum particle no. on bump | Conduction reliability |
|---|---|---|---|---|---|---|---|---|
| Comparative example 10 | (1) | — | — | 90 | 15 | 16 | 4 | x |
| Comparative example 11 | (2) | 10 | 3 | 90 | 16 | 17.7 | 4 | x |
| Example 5 | (3) | 10 | 5 | 90 | 23 | 25.5 | 10 | o |
| Example 6 | (3) | 10 | 7 | 90 | 28 | 31.1 | 11 | o |
| Example 7 | (4) | 10 | 10 | 90 | 30 | 33.3 | 14 | o |
| Example 8 | (5) | 10 | 20 | 90 | 35 | 38.9 | 14 | o |
| Comparative example 12 | (5) | 10 | 200 | 90 | 43 | 47.7 | 18 | — |

In the conduction reliability test, each sample was aged at 121° C. under a pressure of 2 atm at a relative humidity of 100% for 300 hours and then the resistance between terminals adjacent to each other was measured.

With respect to conduction reliability, a sample the resistance of which was 100 mΩ or less was referred to as good (O), while the resistance of which was more than 100 mΩ was referred to as poor (x).

As Table 4 shows, the evaluations of Examples 5 to 8 showed each a high probability of the existence of the conductive particles on the bump and a good conduction reliability.

In contrast thereto, the evaluation of Comparative Example 10 wherein no concave was formed in the insulatforming a concave of a predetermined size in said insulating adhesive layer;

putting, in the concave of said insulating adhesive layer, an anisotropic conductive adhesive film having conductive particles dispersed in an insulating adhesive; and putting at least a portion of a semiconductor device into the concave of said insulating adhesive layer followed by positioning and thermocompression bonding.

2. The process as claimed in claim 1, wherein the concave of said insulating adhesive layer is formed in such a manner that an inner wall of said concave is located inside the scribe line of said wiring board but outside the outmost edge of the connection electrode of said semiconductor device.

3. The process as claimed in claim 1, wherein the concave of said insulating adhesive layer is formed in such a manner that it has a depth less than the thickness of said semiconductor device but more than the outer diameter of the conductive particles in said anisotropic conductive adhesive film.

4. The process as claimed in claim 2, wherein the concave of said insulating adhesive layer is formed in such a manner that it has a depth less than the thickness of said semiconductor device but more than the outer diameter of the conductive particles in said anisotropic conductive adhesive film.

5. The process as claimed in claim 1, wherein said insulating adhesive layer has a melt viscosity larger than the melt viscosity of said anisotropic conductive adhesive film.

6. The process as claimed in claim 2, wherein said insulating adhesive layer has a melt viscosity larger than the melt viscosity of said anisotropic conductive adhesive film.

7. The process as claimed in claim 3, wherein said insulating adhesive layer has a melt viscosity larger than the melt viscosity of said anisotropic conductive adhesive film.

8. The process as claimed in claim 4, wherein said insulating adhesive layer has a melt viscosity larger than the melt viscosity of said anisotropic conductive adhesive film.

9. The process as claimed in claim 5, wherein said insulating adhesive layer has a melt viscosity of from $1 \times 10^6$ to $1 \times 10^9$ mPa·s.

10. The process as claimed in claim 6, wherein said insulating adhesive layer has a melt viscosity of from $1 \times 10^6$ to $1 \times 10^9$ mPa·s.

11. The process as claimed in claim 7, wherein said insulating adhesive layer has a melt viscosity of from $1 \times 10^6$ to $1 \times 10^9$ mPa·s.

12. The process as claimed in claim 8, wherein said insulating adhesive layer has a melt viscosity of from $1 \times 10^6$ to $1 \times 10^9$ mPa·s.

13. The process as claimed in claim 5, wherein said anisotropic conductive adhesive film contains conductive particles surface-coated with a resin having a softening point higher than the temperature at which said insulating adhesive layer is tentatively thermocompression bonded.

14. The process as claimed in claim 6, wherein said anisotropic conductive adhesive film contains conductive particles surface-coated with a resin having a softening point higher than the temperature at which said insulating adhesive layer is tentatively thermocompression bonded.

15. The process as claimed in claim 7, wherein said anisotropic conductive adhesive film contains conductive particles surface-coated with a resin having a softening point higher than the temperature at which said insulating adhesive layer is tentatively thermocompression bonded.

16. The process as claimed in claim 8, wherein said anisotropic conductive adhesive film contains conductive particles surface-coated with a resin having a softening point higher than the temperature at which said insulating adhesive layer is tentatively thermocompression bonded.

17. The process as claimed in claim 9, wherein said anisotropic conductive adhesive film contains conductive particles surface-coated with a resin having a softening point higher than the temperature at which said insulating adhesive layer is tentatively thermocompression bonded.

18. The process as claimed in claim 10, wherein said anisotropic conductive adhesive film contains conductive particles surface-coated with a resin having a softening point higher than the temperature at which said insulating adhesive layer is tentatively thermocompression bonded.

19. The process as claimed in claim 11, wherein said anisotropic conductive adhesive film contains conductive particles surface-coated with a resin having a softening point higher than the temperature at which said insulating adhesive layer is tentatively thermocompression bonded.

20. The process as claimed in claim 12, wherein said anisotropic conductive adhesive film contains conductive particles surface-coated with a resin having a softening point higher than the temperature at which said insulating adhesive layer is tentatively thermocompression bonded.

21. The process as claimed in claim 13, wherein said anisotropic conductive adhesive film has an average particle diameter of the conductive particles of 1 to 10 $\mu$m and a content of said conductive particles of 1 to 15% by volume.

22. The process as claimed in claim 14, wherein said anisotropic conductive adhesive film has an average particle diameter of the conductive particles of 1 to 10 $\mu$m and a content of said conductive particles of 1 to 15% by volume.

23. The process as claimed in claim 15, wherein said anisotropic conductive adhesive film has an average particle diameter of the conductive particles of 1 to 10 $\mu$m and a content of said conductive particles of 1 to 15% by volume.

24. The process as claimed in claim 16, wherein said anisotropic conductive adhesive film has an average particle diameter of the conductive particles of 1 to 10 $\mu$m and a content of said conductive particles of 1 to 15% by volume.

25. The process as claimed in claim 17, wherein said anisotropic conductive adhesive film has an average particle diameter of the conductive particles of 1 to 10 $\mu$m and a content of said conductive particles of 1 to 15% by volume.

26. The process as claimed in claim 18, wherein said anisotropic conductive adhesive film has an average particle diameter of the conductive particles of 1 to 10 $\mu$m and a content of said conductive particles of 1 to 15% by volume.

27. The process as claimed in claim 19, wherein said anisotropic conductive adhesive film has an average particle diameter of the conductive particles of 1 to 10 $\mu$m and a content of said conductive particles of 1 to 15% by volume.

28. A process for mounting a semiconductor device on a wiring board, comprising:

tentatively thermocompression bonding a conductive particle-free insulating adhesive onto a wiring board to thereby form an insulating adhesive layer;

forming a concave of a predetermined size in said insulating adhesive layer;

putting in the concave of said insulating adhesive layer an anisotropic conductive adhesive film having conductive particle dispersed in an insulating adhesive; and putting at least a portion of a semiconductor device into the concave of said insulating adhesive layer followed by positioning and thermocompression bonding, the portion of the semiconductor device placed into the concave having at least one contact hole, each contact hole formed around a contact pad of the semiconductor device; wherein the following relationship is satisfied:

$$V_1 + V_2 \geq V_3 + V_4$$

where:

$V_1$ stands for a volume of said insulating adhesive layer;

$V_2$ stands for a volume of said anisotropic conductive adhesive film;

$V_3$ stands for a volume of an adhesion part of said wiring board; and $V_4$ stands for a volume of the at least one contact hole of the portion of said semiconductor device.

* * * * *